April 4, 1967 R. PLUMBO ET AL 3,312,540

METHOD OF MAKING AN INTEGRATED CIRCUIT PACKAGE

Filed March 5, 1964

ROBERT PLUMBO,
ROBERT E. WASSER,
INVENTORS.

BY THEIR ATTORNEYS
Spensley & Horn 3,312,540

METHOD OF MAKING AN INTEGRATED CIRCUIT PACKAGE

Robert Plumbo, 1301 Tropicana Lane, Santa Ana, Calif. 92705, and Robert E. Wasser, 2146 Larkstone Drive, Orange, Calif. 92667

Filed Mar. 5, 1964, Ser. No. 349,592
1 Claim. (Cl. 65—59)

This invention relates to the microminiaturization of electronic circuitry and more particularly to the packaging of integrated and miniaturized circuits and components.

Microminiaturization in the electronic art is the technique of reliably packaging electronic circuitry and components into as small a volume as possible while still providing adequate electrical connections thereto. The resulting miniaturized circuitry or electrical components are then encapsulated to insure consistent operation and long life. Protection from chemical contamination, good thermal dissipation, shock and vibration resistance, and ease of connection are all desirable features which have caused various types of encapsulating structures to be developed. These desirable characteristics are usually provided by hermetically sealing the circuitry within an enclosure and extending electrical connections through the enclosure with appropriate seals.

One of the prior art encapsulation structures is a glass housing through which the metal electrical leads protrude. This glass housing has a unitary bottom and side portions and, after the integrated circuit or electrical component is placed inside, a glass lid or cover is bonded thereover. This bonding is usually performed by first placing a glass frit around the edges of the adjoining glass members and under suitable heat and pressure, the frit fuses the glass cover and housing together. It has been found, however, that in effecting this glass-to-glass seal, various problems arise. For example, the glass frit does not uniformly melt and bond the adjacent glass edges uniformly throughout the entire bonding length. Moreover, different textures of glass do not bond or adhere uniformly. Leakage occurs with present techniques, when portions of the edges undergoing the glass-to-glass seal are heated unevenly.

The present invention resides primarily in the discovery that the problems associated with glass-to-glass bonding are eliminated by placing a metal frame between the two glass structures to be bonded together and, instead of making a glass-to-glass bonding seal, glass-to-metal seals are made with the metal frame in between. The heat source for fusing is obtained by electrically resistance heating the metal frame while pressure is applied between the two glass structures.

It is therefore an object of the present invention to provide an improved package for microminiaturized or integrated circuits and components.

A further object of the present invention is to provide extremely small hermetically sealed enclosures for microminiaturized or integrated circuits and components.

Another object is to provide improved, relatively inexpensive, enclosures capable of withstanding high temperature processes and extreme shock loading.

Another object is to provide a circuit package having a reliable seal for hermetically sealing miniature and integrated circuits and electrical components therein.

Yet another object of the present invention is to provide an improved technique for effectively making the final seal in a glass package for having miniaturized electrical components.

In accordance with the present invention, integrated or microminiaturized circuits or components are mounted within an enclosure consisting basically of three main parts. The basis of the package is an electrical insulating body, such as glass, having a recess therein within which the component to be encapsulated is mounted. Extending outwardly through the walls formed by the recess are the electrical leads. Mounted on top of the walls is a metallic frame having electrical tabs thereon and fitted over the metal frame is another electrical insulating lid or cover, preferably of glass. The resistance of the metal frame causes the generation of heat when an electrical current is passed through it. The heat thus generated melts the glass and thus effects the bonding of the glass cover to the upper surface of the metal frame and further causes the upper surface of the wall of the glass housing base to adhere to the bottom surface of the metal frame. After the bonding process, the tabs may be removed if desired with little difficulty and with no injury to the sealed glass housing.

The novel features which are believed to be characteristic of the invention, both as to organization and method of operation, together with further objects and advantages will be better understood from the following description considered in connection with the accompanying drawing in which a presently preferred embodiment is illustrated by way of example. It is to be expressly understood, however, that the drawing is for the purpose of illustration and description only, and it is not intended as a definition of the limits of the invention.

The packaging concepts are applicable for enclosing any miniature electric device. The term "electrical device" is utilized herein referring both to individual electrical components and combinations of components into circuitry. Thus, the term "electrical device" includes active circuit elements such as transistors and diodes, passive circuit elements such as resistors and capacitors, as well as circuit modules, integrated circuits, and other forms of microminiaturized circuitry.

Figure 1:
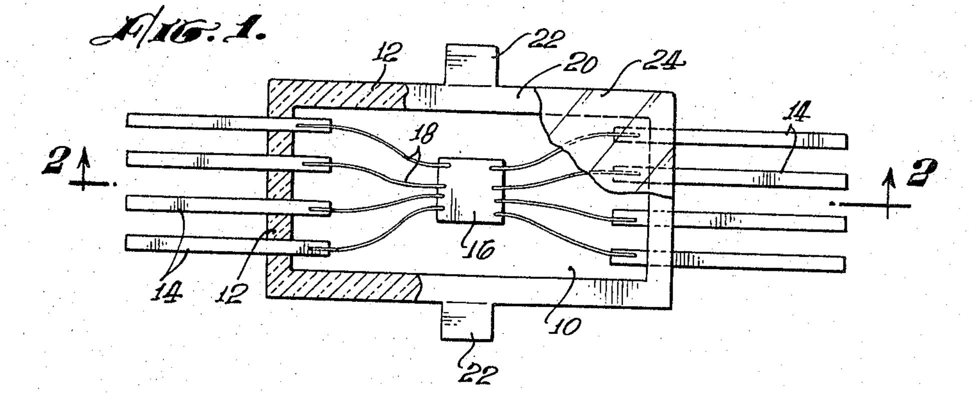
FIGURE 1 is a plan view of an integrated circuit package in accordance with the present invention.
Figure 2:
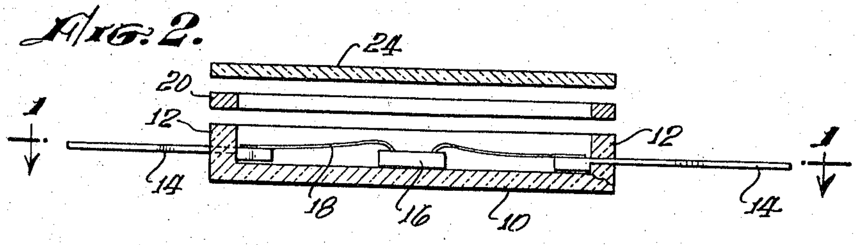
FIGURE 2 is a vertical sectional view taken along the line 1—1 of FIGURE 1.

Referring now to FIGURES 1 and 2, there is shown a rectangular base portion 10 of insulating material such as glass, for example. Extending around this base 10, and integral therewith, are walls 12 through which protrude a plurality of electrical leads 14. The construction of the base with integral walls and with the leads protruding therethrough may be done in a conventional manner and further discussion as to how this portion of the package is made is not believed to be necessary. Leads 14 may be round or may be thin flat strips of conductive material with an enlarged inner surface for affecting a connection with the electrical device 16. Suitable connections 18 interconnect various points on the electrical device with appropriate ones of the electrical leads 14.

A metal frame 20, generally of the configuration of the top surface of the walls 12 is preferably of Kovar metal, an alloy of nickel, cobalt and iron. It is approximately .003" to .005" thick and has electrical connection tabs 22 on opposite sides thereof. The glass lid 24 fits over the frame 20 and is preferably on the order of .010" thick. When these parts are assembled, as shown in FIGURE 2, they are then positioned in a fixture having top and bottom plates such as 28 and 30, shown in FIGURE 3.

Figure 3:
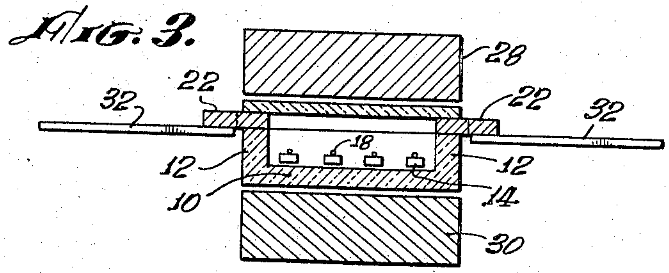
FIGURE 3 is a schematic view illustrating the sealing operation.

As shown in FIGURE 3, suitable contacts 32 are connected to the tabs 22, so that proper voltage may be applied to the frame to cause the frame 20 to serve as a heater element. The voltage to the frame 20 is adjusted to cause the cover and housing to fuse and bond to either side of the frame. A sealing heat of approximately 1700° F. for a period of from 3 to 5 seconds has been found to be adequate in most cases, although this depends upon the configuration desired and the thickness of the device, in addition to the heat dissipation of the plates 28 and 30.

The metal selected for the frame 20 is such that it will seal to the glass composition selected for the cover 24 and walls 12. For example, hard glass sealing alloys consist of a mixture of nickel, cobalt, and iron and is commercially marketed under several trade names such as Kovar, Rodar, Therlo and others. Soft glass sealing alloys consist of nickel, chrome and iron, and are marketed under the trade names of Sealmet 4, Sylvania 4, Carpenter 426 and others. A nickel-iron composition such as Superior 42, Driver-Harris 142, Carpenter 42 and others are soft glass sealing alloys. A chrome-iron composition such as Superior 430, Superior 430 TI, Sealmet 1 and others are also soft glass sealing alloys. Pure metals for hard glass sealing may be molybdenum, rhenium, tungsten, titanium or zirconium, and pure metals for soft glass sealing may be platinum, nickel, oron or OFHC (oxygen free high conductivity) copper.

The fixture plates 28 and 30 are adapted to apply pressure to the seal area to effect the intimate contact of the glass and metal surfaces, and to act as a heat sink to prevent overheating of the electronic circuitry within the package. After heating or annealing, the two tabs 22 may be removed by shearing or other suitable means.

While a rectangular configuration has been shown in the illustrative embodiment this sealing technique is suitable for round, square or other shapes that can serve for a conduction source for electricity as well as provide structure for packaging of the electrical device.

There has been described a novel packaging technique for miniaturized electrical devices resulting in an extremely compact structure that is relatively simple and inexpensive to fabricate. The resulting hermetically sealed package is capable of withstanding high temperature processing and the tight glass-to-metal seals prevent damage during processing or extreme shock testing. The package assembly is quite simple since the package consists basically of three parts. The base and wall portions with electrical conductors extending therethrough, the glass cover, and the interconnecting metal frame, all are parts of relatively simple design.

Although the invention has been described with a certain degree of particularity, it is to be understood that the present disclosure has been made only by way of example, and that numerous changes in the details of construction and the combination and arrangement of parts may be resorted to without departing from the spirit and scope of the invention as hereinafter claimed.

What is claimed is:

A method of making a circuit package comprising: providing a pair of relatively thin, flat, glass, casing-forming parts at least one of which has an open cavity on the inner side thereof, said casing-forming parts when put together forming an enclosure for an electrical circuit device, placing the electrical circuit device within the cavity of said one casing part with terminals electrically connected thereto and exposed to the outside of the casing part, placing a frame made of a resistance forming material in direct contact between all the confronting surfaces of said glass casing-forming parts which frame heats up to a glass fusing temperature when current is passed through the frame, placing the resulting assembly between a pair of pressure applying members which form heat sinks to carry heat away to avoid damage to said electrical circuit device and simultaneously passing current through said resistance frame to heat the same to a temperature which fuses the glass casing-forming parts, and squeezing said assembly with said pressure applying members to bond the casing-forming parts to the resistance frame to form a sealed assembly of the casing-forming parts and the resistance frame, wherein the casing parts are bonded only to the resistance frame and the electrical circuit device within the resulting casing remain undamaged by the heat generated in the resistance frame because of the heat carried away by the pressure applying members.

References Cited by the Examiner

UNITED STATES PATENTS

| | | | |
|---|---|---|---|
| 2,125,316 | 8/1938 | Ronci | 174—50 X |
| 2,744,655 | 5/1956 | Vnuk | 156—275 X |
| 2,817,046 | 12/1957 | Weiss | 174—52 X |
| 2,933,634 | 4/1960 | Lederer | 174—50 X |

OTHER REFERENCES

Walker Advance in Electronic Circuit Packaging, vol. 2 Plenum Press, New York 1962 TK7870A35 pp. 91, 92, and 103.

LEWIS H. MYERS, *Primary Examiner.*

D. CLAY, *Examiner.*